United States Patent
Ohba et al.

(10) Patent No.: US 7,185,296 B2
(45) Date of Patent: Feb. 27, 2007

(54) METHOD OF EXTRACTION OF WIRE CAPACITANCES IN LSI DEVICE HAVING DIAGONAL WIRES AND EXTRACTION PROGRAM FOR SAME

(75) Inventors: Hisayoshi Ohba, Kawasaki (JP); Jun Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 180 days.

(21) Appl. No.: 10/898,960

(22) Filed: Jul. 27, 2004

(65) Prior Publication Data
US 2005/0193354 A1   Sep. 1, 2005

(30) Foreign Application Priority Data
Feb. 26, 2004   (JP) .............................. 2004-051812

(51) Int. Cl.
*G06F 17/50* (2006.01)

(52) U.S. Cl. .............................. 716/5; 716/10; 716/11; 716/12

(58) Field of Classification Search ................ 716/5–6, 716/10–14
See application file for complete search history.

(56) References Cited

U.S. PATENT DOCUMENTS 6,077,309 A * 6/2000 Lin .............................. 716/14
6,185,722 B1 * 2/2001 Darden et al. ................. 716/5
6,665,845 B1 * 12/2003 Aingaran et al. ............... 716/5
6,968,522 B1 * 11/2005 Frank et al. .................... 716/5
2004/0049751 A1 * 3/2004 Teig et al. ...................... 716/5
2004/0225990 A1 * 11/2004 Jacques et al. ............... 716/13

FOREIGN PATENT DOCUMENTS

| JP | 6-120343 | 4/1994 |
| JP | 2000-207432 | 7/2000 |

\* cited by examiner

*Primary Examiner*—Paul Dinh
(74) *Attorney, Agent, or Firm*—Staas & Halsey LLP

(57) ABSTRACT

A method and program for capacitance extraction enabling reduction of the need for division into segments during extraction of capacitances in an LSI device having diagonal wires, so that increases in the number of processes for capacitance extraction can be suppressed are provided. In the method and program, a wire model is generated in which, for a wire segment such that the wire of interest and an adjacent wire are not parallel, either the wire of interest or the adjacent wire is replaced so as to be parallel to the other, and the capacitance of the wire of interest is extracted for this wire model, so that the number of processes in the capacitance extraction process can be reduced.

14 Claims, 15 Drawing Sheets

WIRE LAYOUT → RC EXTRACTION MODEL

LNX. wire of      LNY. adjacent wire
interest

WIRE LAYOUT → RC EXTRACTION MODEL

FIG. 9

| Subject (RLC) | Matching data | RLC value | Calculation formula |
|---|---|---|---|
| Ca | Lj: d1<br>d2<br>-<br>dn | Ca=xx (F/$\mu$m$^2$)<br>Ca=yy<br>—<br>Ca=zz | Ca × W × La |
| Cc | Lj: s1<br>s2<br>-<br>sn | Cc=xx (F/$\mu$m)<br>Cc=yy<br>—<br>Cc=zz | Cc × La |
| Cf | Lj: sp1<br>sp2<br>-<br>spn | Cf=xx (F/$\mu$m)<br>Cf=yy<br>—<br>Cf=zz | Cf × La |
| Cv | Lj: sp1<br>sp2<br>-<br>spn | Cv=xx (F/$\mu$m)<br>Cv=yy<br>—<br>Cv=zz | Cv × La |
| Cd | Lj: d1<br>d2<br>-<br>dn | Cd=xx (F/$\mu$m)<br>Cd=yy<br>—<br>Cd=zz | Cd × La |
| R | L1<br>L2<br>-<br>Ln | Rs=xx ($\Omega$/m$^2$)<br>Rs=yy<br>—<br>Rs=zz | Rs × La × W |
| L | L1<br>L2<br>-<br>Ln | Ls=xx (H)<br>Ls=yy<br>—<br>Ls=zz | Ls × La |

WIRE IDENTIFICATION PROCESS $$C = \int_{L1}^{L2} \varepsilon \frac{S}{d(L)} dL = \varepsilon \frac{S}{dm}$$

METHOD OF EXTRACTION OF WIRE CAPACITANCES IN LSI DEVICE HAVING DIAGONAL WIRES AND EXTRACTION PROGRAM FOR SAME

CROSS-REFERENCE TO RELATED APPLICATIONS

This application is based upon and claims the benefit of priority from the prior Japanese Patent Application No. 2004-051812, filed on Feb. 26, 2004, the entire contents of which are incorporated herein by reference.

BACKGROUND OF THE INVENTION

1. Field of the Invention

This invention relates to a method and computer program for extraction of wire capacitances in LSI devices having diagonal wires, and in particular relates to a method and computer program for wire capacitance extraction enabling simplification of the wire capacitance extraction process when diagonal wires are included in the LSI device.

2. Description of the Related Art

LSI device design processes are normally performed with a CAD tool executed by a computer. LSI device design processes generally include a logic design process to design the logic circuitry connecting logic gates; a layout design process to lay out the logic circuitry on an actual chip; a process to extract RLC values (resistances, inductances, capacitances) of the layout interconnects from the layout data, and to determine delay times for each signal path from the extracted RLC values and from cell and macro AC characteristics; a timing verification (logic verification) process to check, using these delay times, whether the logic circuit operates normally; and a physical verification process to check whether the layout data satisfies design rules. Through layout design, the layout data including wiring pattern data for each layer on the chip is created, and based on this layout data the RLC values for interconnects are extracted. The RLC extraction process, delay time calculation process, and logic simulation process are each realized by execution of a program by a computer.

In the above RLC extraction process, RLC values in an adjacent wire structure of actual interconnects can be calculated based on the layout data (see for example Japanese Patent Laid-open No. 2002-299456), but use of such a method requires a large amount of computer processing in the extraction process. Hence a method has been proposed of referencing an RLC rule table generated in advance according to wire widths, distances from adjacent wires, overlap areas, and other parameters, to extract from the rule table the RLC values corresponding to parameters matching the wire widths, adjacent wire distances, and overlap areas contained in the layout data (see for example Japanese Patent Laid-open No. 2002-368088, FIGS. 1 and 12). By extracting values through such matching, processing to compute RLC values can be eliminated.

Whichever method is used, the wire of interest is divided into segments according to the surrounding wire structure, and the above RLC extraction is performed for each segment. For example, the capacitance value of a wire of interest is determined by the distance of the wire of interest from adjacent wires and the overlap area, so that when extracting the capacitance value, distances from adjacent wires and areas must be extracted from layout data and used as parameters to extract the capacitance value. For the resistance value, the cross-sectional area and length of the wire of interest are necessary, and for the inductance, the length and other properties of the wire of interest are needed.

SUMMARY OF THE INVENTION

An object of this invention is to provide a method and program for capacitance extraction enabling reduction of the need for division into segments during extraction of capacitances in an LSI device having diagonal wires, so that increases in the number of processes for capacitance extraction can be suppressed.

In order to attain the above object, a first aspect of this invention is a wire capacitance extraction method for interconnects in an integrated circuit, comprising:

a wire model generation step of generating wire model data by replacing a wire of interest or a wire adjacent thereto for both wires to become parallel with interval of prescribed distance, for a wire segment, included in layout data of said interconnects, in which the wire of interest and the wire adjacent thereto are not parallel; and, a capacitance extraction step of extracting a capacitance value for said wire segment of the wire of interest included in the wire model data, based on said prescribed distance.

In a preferred embodiment of the above first aspect of this invention, the wire capacitance extraction method according to claim 1, wherein said wire model generation step has a process of calculating said prescribed distance based on a capacitance value which is obtained by integration from a starting point to an ending point of said wire segment according to a distance between said wire of interest and the adjacent wire.

In a preferred embodiment of the above first aspect of this invention, the wire capacitance extraction method according to claim 1, wherein, in said wire model generation step, when there is a portion of said wire segment such that the distance between the wire of interest and the adjacent wire exceeds a prescribed threshold distance, the portion exceeding the threshold distance is replaced by a wire segment having the wire of interest and the adjacent wire being parallel with interval of said threshold distance, and the portion not exceeding said threshold distance is replaced by a wire segment having the wire of interest and the adjacent wire being parallel with interval of said prescribed distance.

In order to attain the above object, a second aspect of this invention is a wire capacitance extraction method for interconnects in an integrated circuit, comprising:

a wire model generation step of generating wire model data by replacing diagonal wires which extends in directions diagonal to X and Y directions with main-axis wires which extends in the X and Y directions so as to become parallel with interval of prescribed distance, for a wire segment in which a wire of interest and a wire adjacent thereto are included, in which either the wire of interest and the adjacent wire is said diagonal wire, and which is included in layout data of said interconnects having the main-axis wires and the diagonal wires; and, a capacitance extraction step of extracting a capacitance value for said wire segment of the wire of interest included in the wire model data, based on said prescribed distance.

In order to attain the above object, a third aspect of this invention is a program which causes a computer to execute the wire capacitance extraction method of the above first or second aspects.

By means of the first aspect of this invention, a wire model is generated in which, for a wire segment such that the wire of interest and an adjacent wire are not parallel, either the wire of interest or the adjacent wire is replaced so as to be parallel to the other, and the capacitance of the wire of interest is extracted for this wire model, so that the number of processes in the capacitance extraction process can be reduced.

By means of the second aspect of this invention, a wire model is generated in which the wire of interest and an adjacent wire are parallel by replacing a diagonal wire with a main-axis wire for a wire segment having diagonal wires in layout data, and the capacitance of the wire of interest is extracted for this wire model, so that the number of processes in the capacitance extraction process can be reduced.

Also, if the delay time for a wire is calculated from the capacitance value extracted using one of the above capacitance extraction methods, the capacitance value model is simplified, so that the number of processes in the delay time generation process can be reduced.

BRIEF DESCRIPTION OF THE DRAWINGS

FIG. 9 shows one example of an RLC rule table in this aspect;

DESCRIPTION OF THE PREFERRED EMBODIMENTS

In the multilayer wiring structures of the LSI devices of recent years, in addition to main-axis wires positioned on an X- and Y-direction grid, there have been proposals to use diagonal wires, positioned in diagonal directions on the grid. Diagonal wires enable connection of two points over the shortest distance in a diagonal direction, as compared with the use only of main-axis wires in the X and Y directions, with the advantages that wire capacitances and resistances can be reduced and faster operation becomes possible.

However, the existence of such diagonal wires has the disadvantage of rendering complex the capacitance extraction process in particular among the processes of RLC extraction.

Figure 1A:
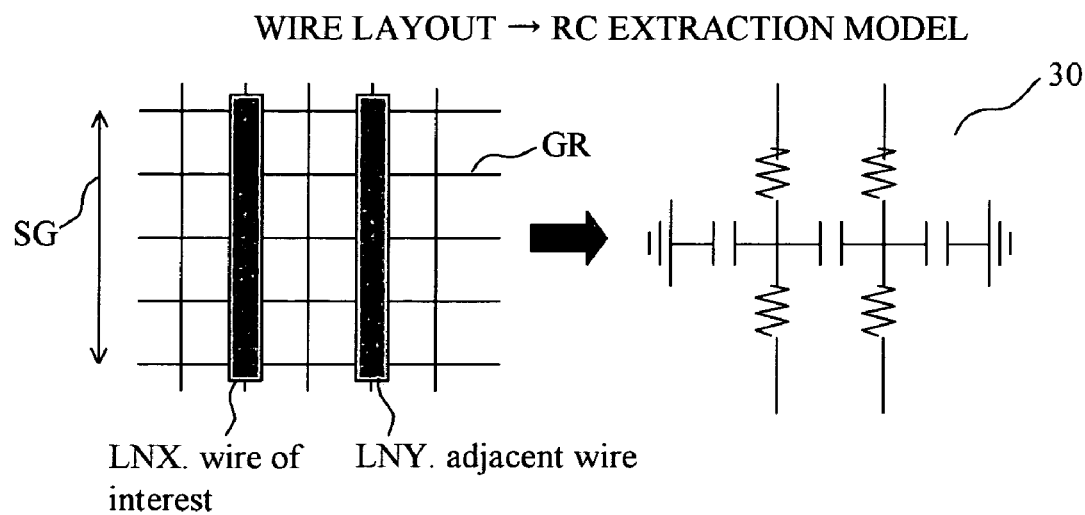
FIG. 1 is a drawing to explain problems with processes to extract capacitances due to diagonal wires.

FIG. 1 is a drawing to explain problems in a process to extract the capacitance of diagonal lines. As indicated in FIG. 1A, when both the wire of interest LNX and an adjacent wire LNY are main-axis wires extending in parallel on the grid GR, the distance from the adjacent wire LNY is constant along the length direction of a segment SG of the wire of interest LNX, so that the capacitance value can be extracted and an RC extraction model 30 generated based on this constant distance for the segment SG. In RLC extraction, except in the case of ultra-fast circuits, the inductance L of the wire has little effect on the delay characteristics, and only the RC values are extracted; hence in the example of FIG. 1, the case of extraction of only the RC values is explained.

Figure 1B:
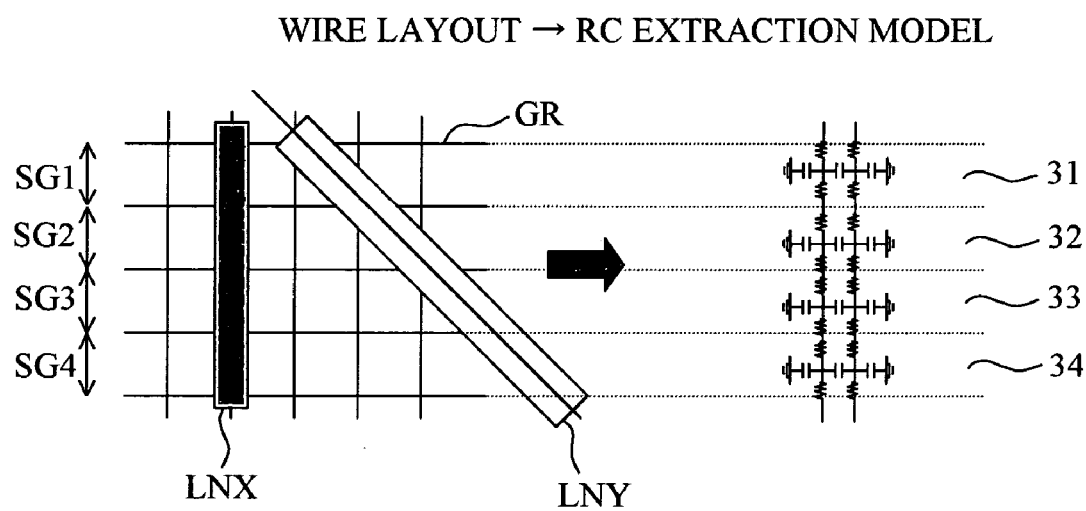

On the other hand, if as in FIG. 1B there exists a diagonal wire LNY adjacent to the wire of interest, the distance along the length direction of the wire of interest LNX from the adjacent wire LNY is not constant, so that the wire LNY must be divided into small segments (SG1 to SG4) for capacitance extraction, and the capacitance extracted for each small segment. As a result the number of processes for capacitance extraction is increased, and a large amount of computer processing becomes necessary. Further, as a result of fine division into segments the corresponding RC extraction model is divided into models 31 to 34, and the number of processes for computation of delay times for the signal path, which are necessary for the timing verification process, is increased.

Below, aspects of the invention are explained referring to the drawings. However, the technical scope of the invention is not limited to these aspects, but extend to the items described in the scope of claims and to items equivalent thereto.

Figure 2:
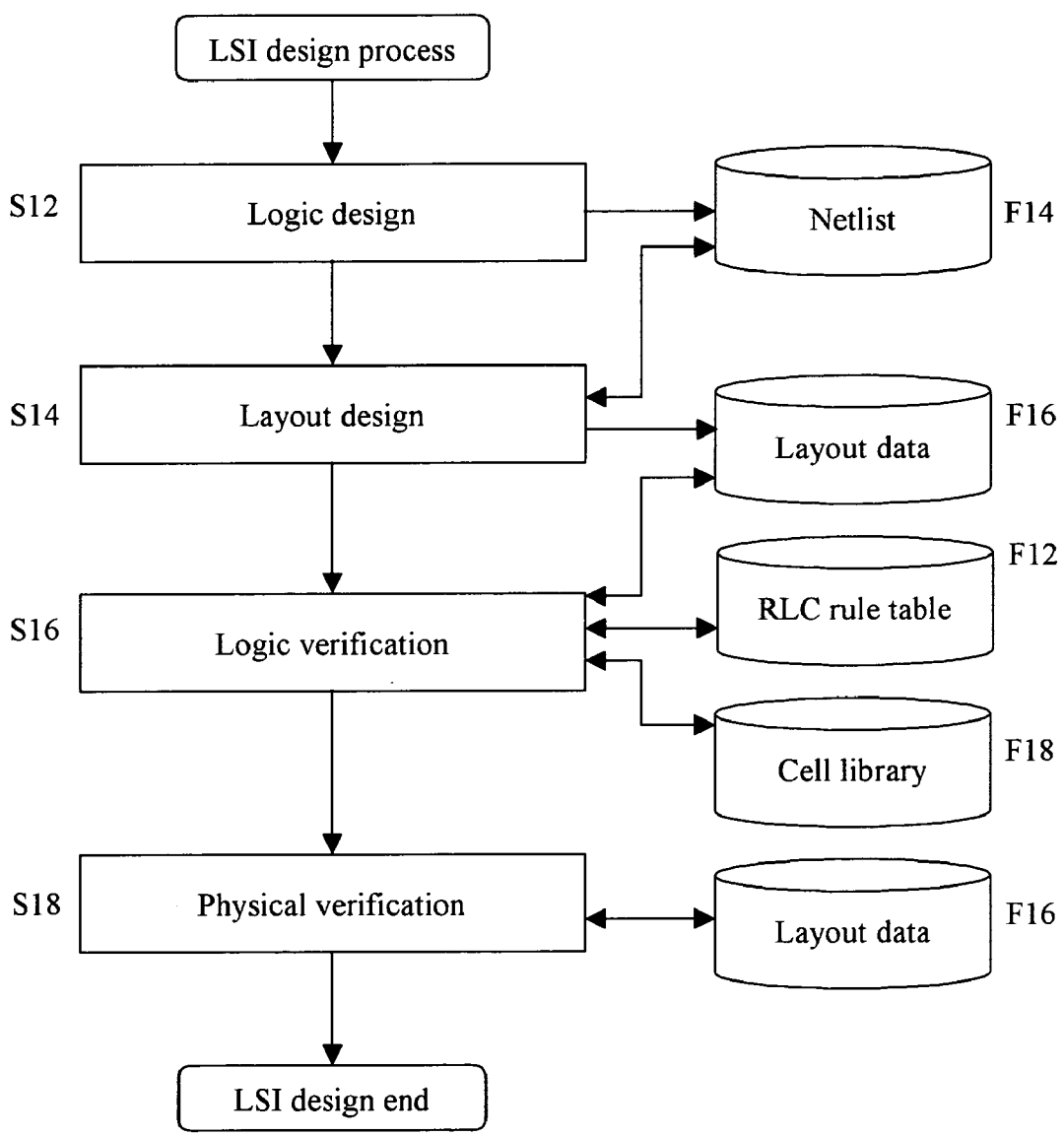
FIG. 2 is a flowchart showing the LSI design process of this aspect.

FIG. 2 is a flowchart showing a process for LSI device design in this aspect. Preceding the LSI device design process, an RLC rule table generation process is performed as a preparatory process, in which RLC (resistance, inductance, capacitance) values for wires are calculated in correspondence with the distance from adjacent wires, opposing area, and other parameters, based on process rules identifying the multilayer wiring structure. Process rules has data on the thickness and material of each wiring layer, the insulating film structures between wiring layers, the insulating film structures within wiring layers and similar for the multilayer wiring structure of an LSI device. Hence by referencing the process rules, RLC values for wires in possible adjacent wire structures can be determined in advance. The RLC rule table F12 generated in this preparatory stage is stored as a data file in storage means of a computer.

In this aspect, RLC values for wires are calculated; but except when extremely high-speed operation is performed, it is sufficient to calculate only resistance values R and capacitance values C directly related to delay characteristics.

Next, the process to design an individual LSI device has a logic design process (S12) to design a logic circuit connecting logic gates; a layout design process (S14) to lay out the logic circuit on an actual chip; a logic verification process (S16) to calculate delay times for signal paths of wires in the layout, and check whether the logic circuit operates normally with the timing resulting from these delay times; and a physical verification process (S18) to check whether the layout data satisfies the design rules.

Figure 3:
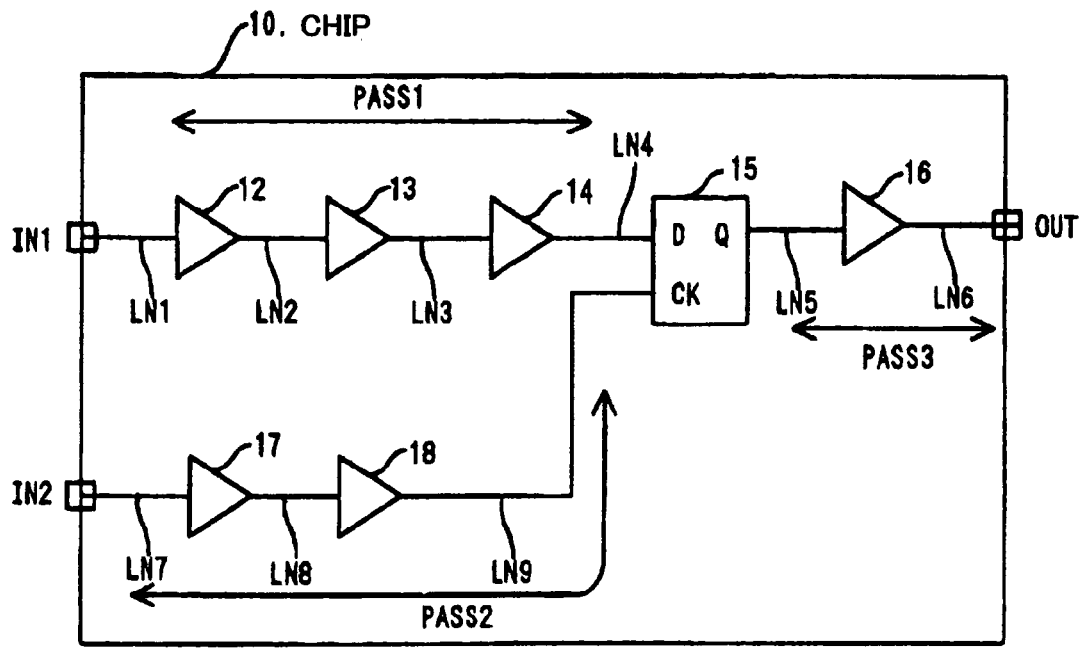
FIG. 3 shows an example of a logic circuit generated in logic design process.

In the logic design process S12, the designer uses a CAD tool for logic design to design a logic circuit which realizes fixed functions. As a result, a netlist F14 is generated including cells and macros having logic gates as well as data for connections between these. When the logic design process is finished, a logic circuit such as that shown in FIG. 3 is completed. This logic circuit can be specified by the netlist F14. The logic circuit example of FIG. 3 is an example in which gates 12 to 14 and 16 to 18 and a flip-flop 15 are connected between input terminals IN1, IN2 and an output terminal OUT within the chip 10. These gates and flip-flop are connected by the interconnects LN1 to LN9.

After this logic design process, the layout design process S14 is performed. Here, cells and macros are positioned on an actual chip, and layout of interconnect patterns connecting these is performed, to generate the layout data F16. When interconnects are realized through multilayer wiring in the chip, layout data is generated for each interconnect layer. Hence the layout data F16 has, in the example of the logic circuit of FIG. 3, data for the wire patterns for the interconnects LN1 to LN9.

Figure 5:
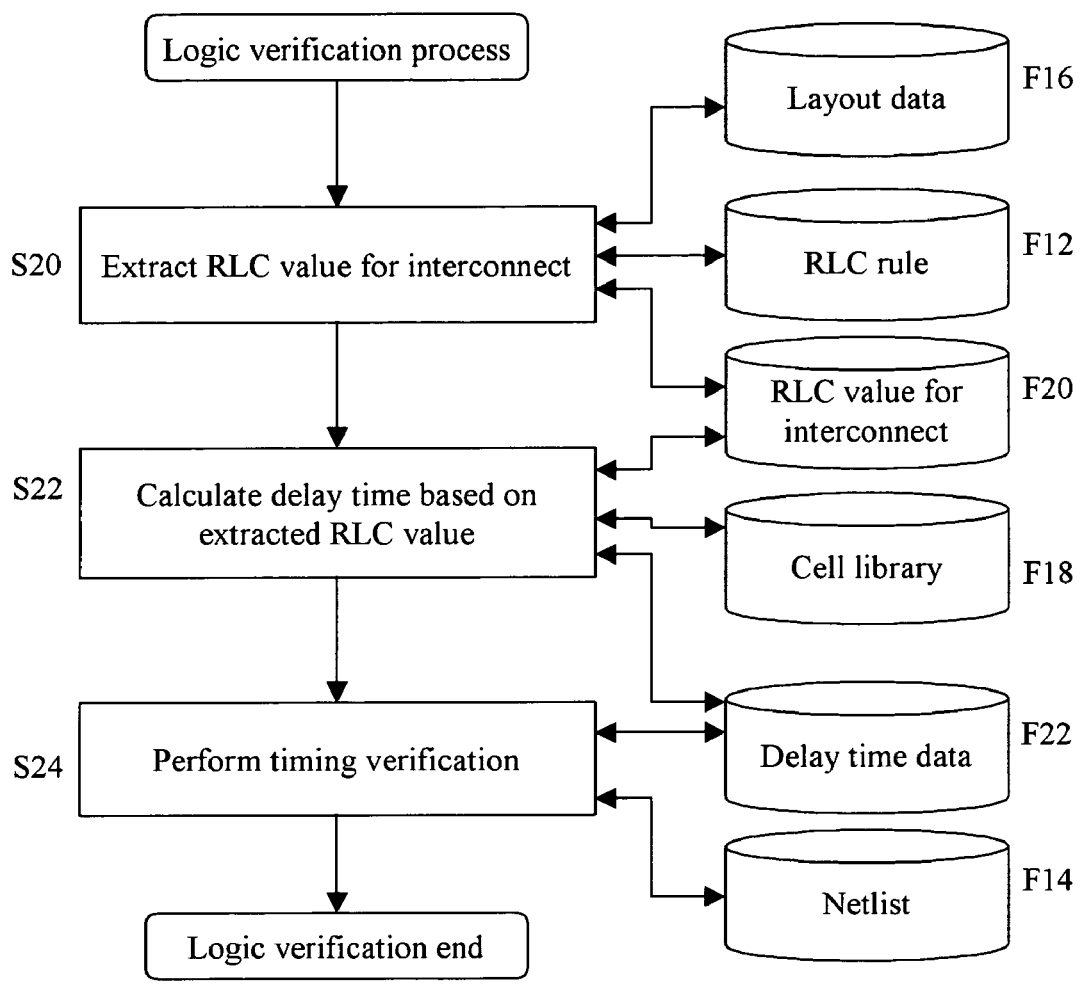
FIG. 5 is a flowchart of a logic verification process.

Then, the logic verification process (S16) is performed for the layout data F16. FIG. 5 is a flowchart of the logic verification process; the logic verification process is here explained referring to this drawing. First, the resistances R, capacitances C and, if necessary, inductances L of the interconnects LN1 to LN9 are extracted based on the layout data F16 (S20). In this RLC value extraction process, the parameters of an RLC rule table F12 generated in the preparatory stage are matched with the parameters of a wire of interest, and the RLC values corresponding to matching parameters are read from the RLC rule table F12. By referencing the RLC rule table, there is no need to compute RLC values for a wire of interest each time based on the layout data, so that computer processing time can be reduced.

Next, signal propagation delay times are calculated for the signal paths PASS1 to PASS3 based on the extracted RLC data for wires (RC extraction model of FIG. 1) and on the AC characteristics of cells and macros in the cell library F18 (S22). The AC characteristics of the cells and macros are, for example, in the case of an inverter, a falling output for rising input, output driving capacity, and similar.

Figure 4:
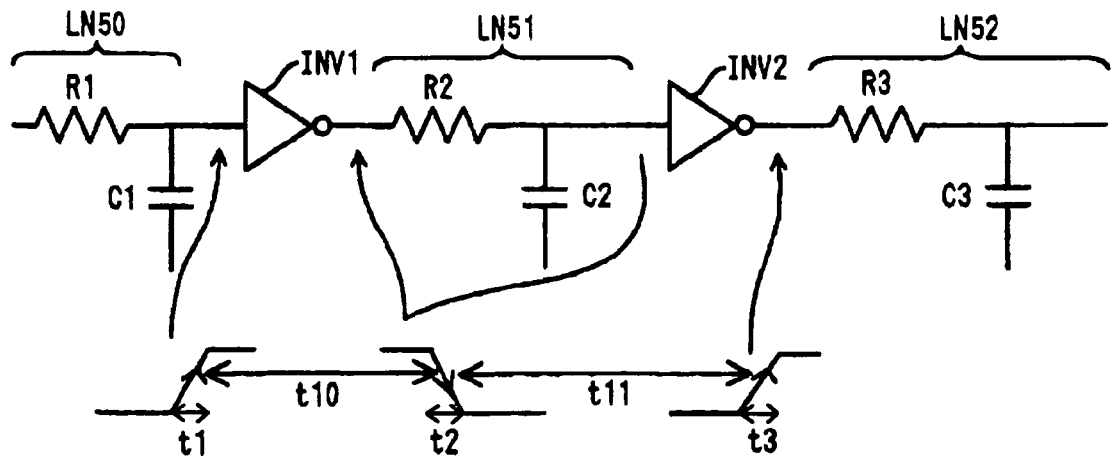
FIG. 4 is a drawing to explain calculation of the signal propagation delay time for a signal path.

FIG. 4 is a drawing to explain calculation of the signal propagation delay time for a signal path. In this example, the inverters INV1, INV2 are connected in series. In this case, an interconnect LN50 with resistance R1 and capacitance C1 is connected to the input terminal of the initial-stage inverter INV1. This interconnect LN50 is driven by a gate in the preceding stage, not shown, and the input signal to the inverter INV1 is a rising waveform with a delay time of t1. The delay time t1 of this rising waveform is calculated from the driving capacity of the preceding-stage gate and the resistance R1 and capacitance C1 and similar of the interconnect LN50.

In response to the rising waveform input to the inverter INV1, the output falls after a fixed delay time t10. The falling-output characteristic depends on the resistance R2 and capacitance C2 of the interconnect LN51 connected to the output terminal, and on the output driving characteristic of the inverter INV1. Similarly in the next-stage inverter INV2 also, in response to the falling-waveform input, the output rises after a fixed delay time t11. This output rising characteristic t3 likewise is determined by the driving capac-ity of the inverter INV2 and on the resistance R3 and capacitance C3 of the wire connected to the output.

In this way, signal propagation delay times can be calculated in order along the signal path from the RLC values of the interconnects and the cell AC characteristics. As a result, in the example of the logic circuit of FIG. 3, the signal propagation delay times for the signal paths PASS1, 2, 3 are determined. If the inductance of an interconnect is extracted, the resulting delay characteristic can also be reflected to the signal propagation delay time for the signal path.

When the signal propagation delay times for signal paths are obtained, timing verification (S24) is performed to check whether the logic circuit operates normally. In this timing verification, a check is performed to determine whether the logic circuit operates normally for test input data, and whether the expected test output data is output. In this case, the signal propagation delay times for signal paths determined above are used to check whether, in the example of FIG. 3, the timing of clock input to the clock terminal CK of the flip-flop 15 coincides with the timing of data input to the data input terminal D. That is, the data input D must be maintained at the correct level between the setup time and hold time around the leading edge of the clock CK. In order to perform this check, the delay times of the signal paths PASS1 and PASS2 must be calculated appropriately.

Figure 6:
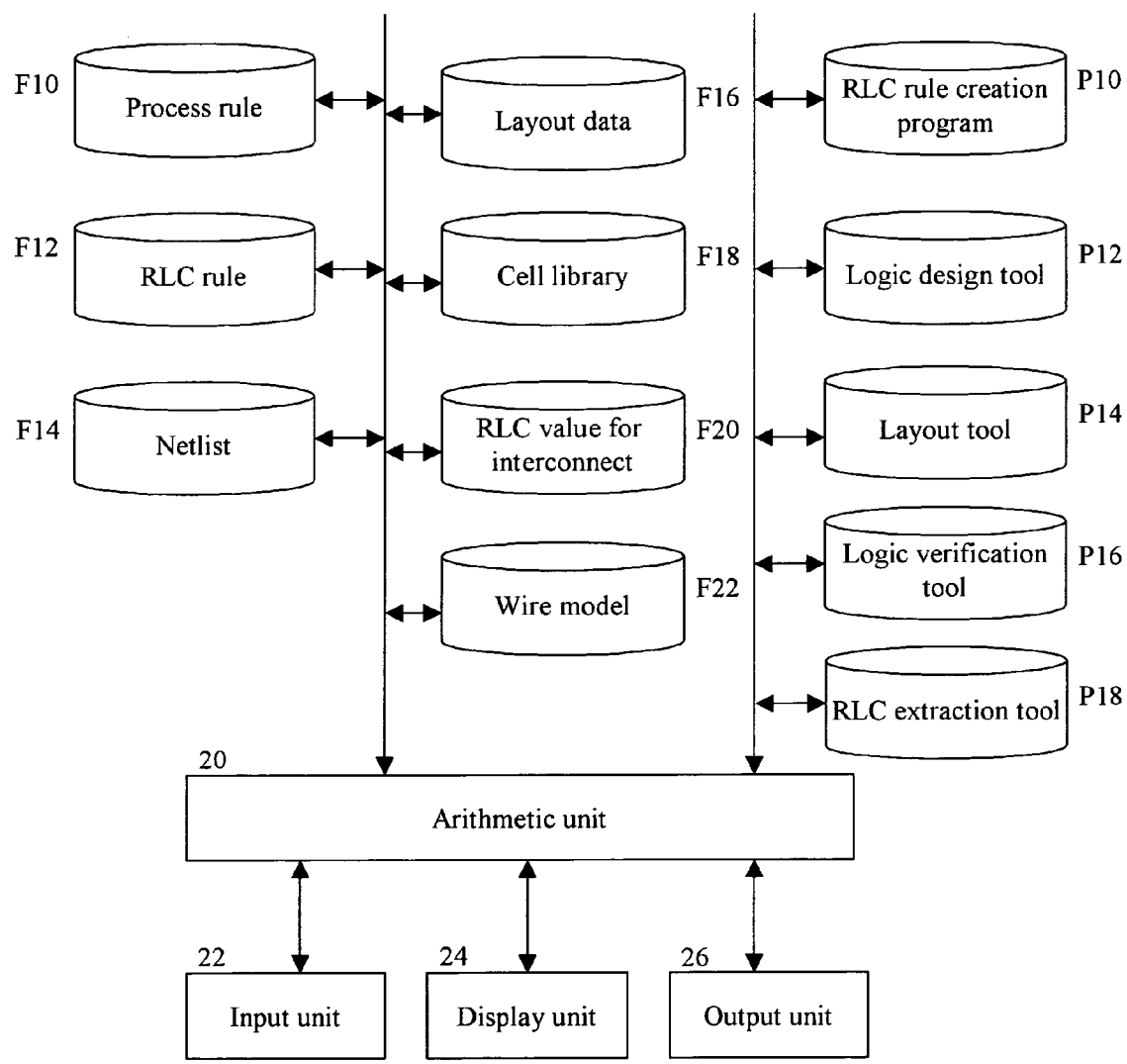
FIG. 6 shows the configuration of a computer system of this aspect.

FIG. 6 shows the configuration of a computer system in this aspect. In this computer system, a keyboard or other input unit 22, monitor or other display unit 24, and printing device or other output unit 26 are connected to a arithmetic unit 20. Further, a storage unit stores a process rule file F10 which specifies an LSI multilayer wiring structure, an RLC rule table file F12 in which are RLC values for wires calculated in the preparatory stage based on process rules, and corresponding to adjacent wire distances, opposing areas, and other parameters, a netlist file F14 generated in logic design, a layout data file F16 generated in layout design, a cell library file F18 having logic data and layout data for cells and macros included in the LSI device, an RLC value file F20 for interconnects extracted in the RLC extraction process, wire model data F22 generated by substituting main-axis wires for diagonal wires from the layout data F16 in the RLC extraction process, and other files, as well as an RLC rule creation program P10, logic design tool P12, layout tool P14, logic verification tool P16, RLC extraction tool P18, and other programs.

The functions of the logic design tool P12, layout tool P14, and logic verification tool P16 are as explained above. The logic verification tool P16 has a wire RLC extraction tool (P18, S20), a delay time calculation tool (S22), and a timing verification tool (S24), as shown in FIG. 5. In this aspect, the RLC extraction tool P18 references the RLC rule table F12 to extract RLC values, and so the capacitance value rule table is explained below.

Figure 7:
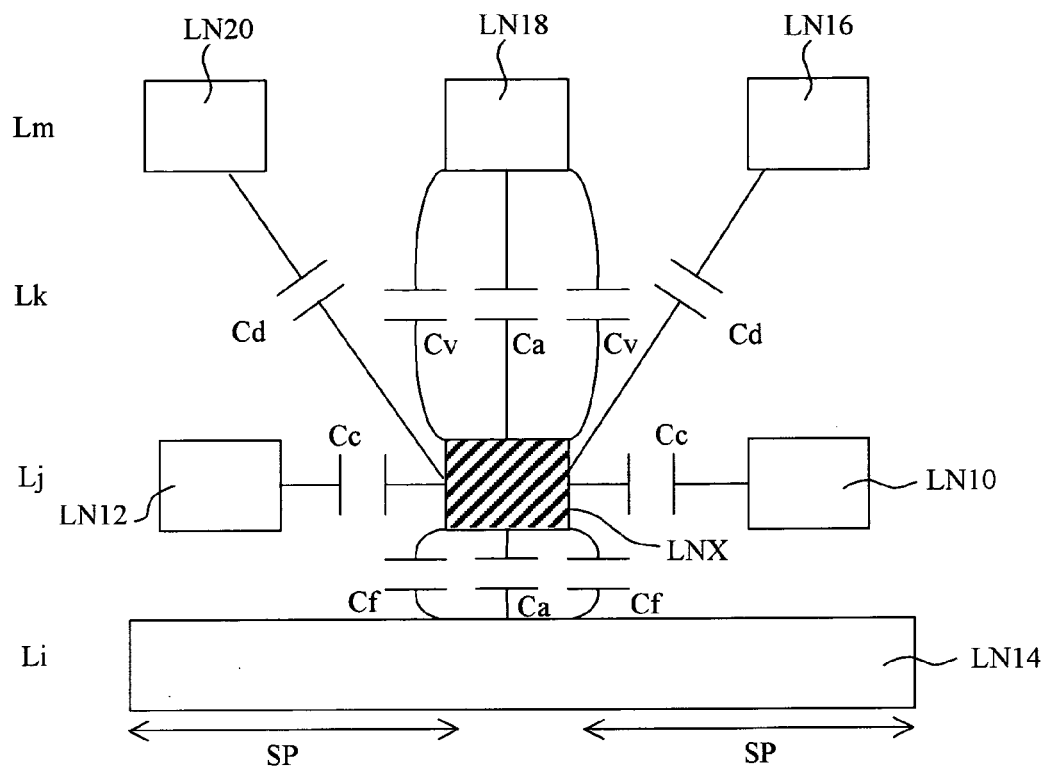
FIG. 7 shows capacitances extracted in a typical multilayer wiring structure.

FIG. 7 shows the capacitances extracted in a typical multilayer wiring structure. In the example of FIG. 7, wires are provided in alternation in the X direction (the horizontal direction to the figure) and the Y direction (the vertical direction to the figure) in the four wiring layers Li, Lj, Lk, Lm; however, it so happens that wires are not provided in the wiring layer Lk. Taking the wire LNX in the wiring layer Lj as the wire of interest, there exist an adjacent wire capacitance Cc with the adjacent wires LN10 and LN12 in the same wiring layer Lj; there exist an area capacitance Ca and diagonal-direction fringe capacitances Cf with the adjacent wire LN14 in the lower wiring layer Li; there exist an area capacitance Ca and diagonal-direction fringe capacitances Cv with the adjacent wire LN18 immediately above the wire LNX in the upper wiring layer Lm; and there exist diagonal wire capacitances Cd with the wires LN16, LN20 adjacent in diagonal directions in the upper wiring layer Lm.

The area capacitances Ca can be calculated from the overlap area S of the opposing wire, the adjacent wire distance d, and the dielectric constant ε of the insulating film between the wires, using Ca=εS/d for the capacitance per unit length. For the adjacent wire capacitance (coupling capacitance) Cc, the capacitance per unit length is similarly found from the distance between wires d, the wire thickness, and the dielectric constant of the insulating film between the wires. The fringe capacitances Cf and Cv depend on the length sp and dielectric constant of the edge portion of the adjacent wire LN14. And, the diagonal wire capacitances Cd depend on the diagonal-direction distance d and dielectric constant.

Figure 8:
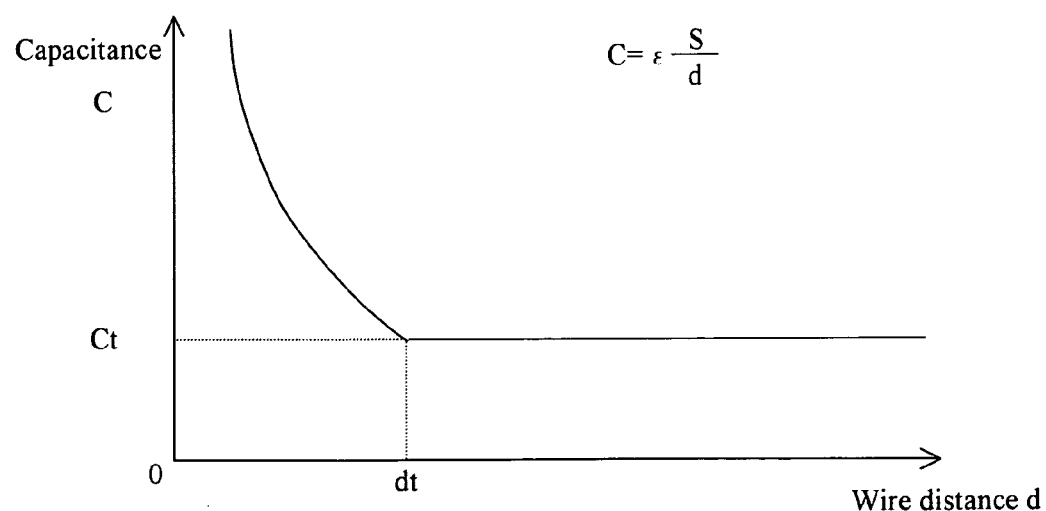
FIG. 8 is a graph showing the relation between the distance between wires d and capacitance C.

FIG. 8 is a graph showing the relation between wire distances d and capacitances C. Capacitances between wires C and distances between wires d are in an inverse-proportional relationship, as indicated by C=εS/d; but when the distance between wires exceeds a prescribed threshold distance dt, the dependence of capacitance on the distance is reduced, and so by assigning a constant capacitance the capacitance table can be simplified.

FIG. 9 shows one example of an RLC rule table of this aspect. The RLC rule table has RLC values corresponding to parameters to be matched for each of the above capacitances Ca, Cc, Cf, Cv, Cd, resistances R, and inductances L. For example, in the case of an area capacitance Ca the parameters for matching are the wiring layer Lj of the wire of interest and the adjacent wire distance d, and capacitance Ca per unit area is acquired corresponding to distances d1, d2, ..., dn from another layers. That is, the distance d corresponding to an area capacitance of a wire of interest in actual layout data is compared with parameters d in the rule table, and the capacitance value Ca of the matching parameter is extracted from the rule table. Then, from the wire width W of the wire of interest and the length La of the segment of the wire of interest for extraction, the area capacity Ca×W×La for the wire of interest is extracted.

In the case of adjacent wire capacitances Cc, if the wiring layer of the wire of interest is identified, the thickness and similar of the wire are identified, and so the parameters for matching are the wiring layer Lj of the wire of interest and the wire distance s, and the rule table has capacitances Cc per unit length corresponding to the wiring layer Lj and distances s1, s2, ..., sn as parameters. Fringe capacitances Cf, Cv have as parameters for matching the wiring layer Lj and fringe length sp; diagonal-wire capacitances Cd have as parameters for matching the wiring layer Lj and distance thereto d.

Further, resistances R and inductances L correspond to the wiring layer of the wire of interest, so that the parameter for matching is the wiring layer. Resistances R in the rule table are resistances per unit cross-sectional area, so that computations are performed employing the width W and length La of the wire of interest.

Figure 10:
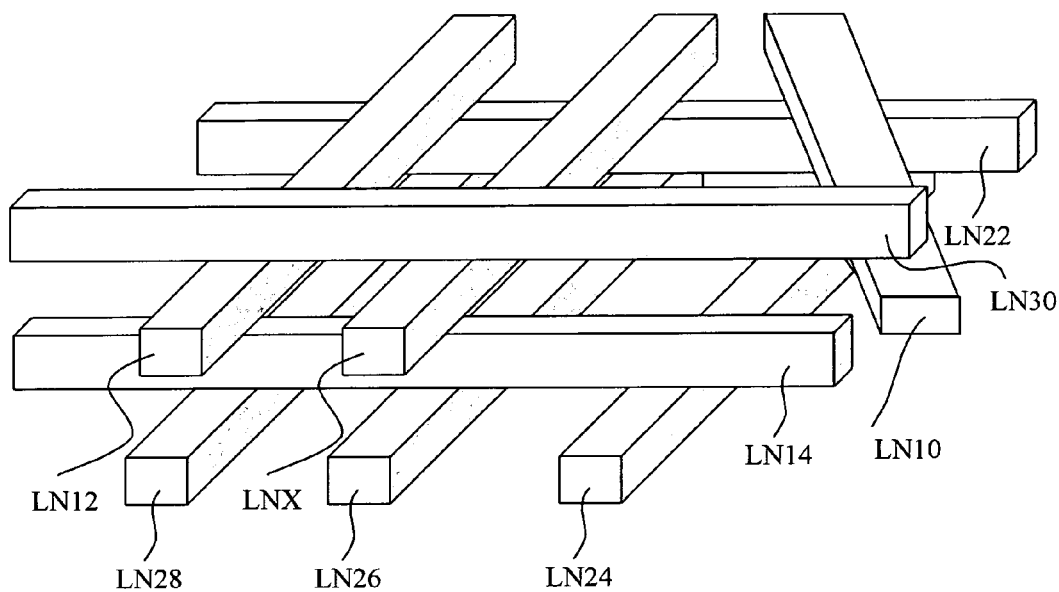
FIG. 10 is a perspective view showing one example of a multilayer wiring structure.
Figure 11:
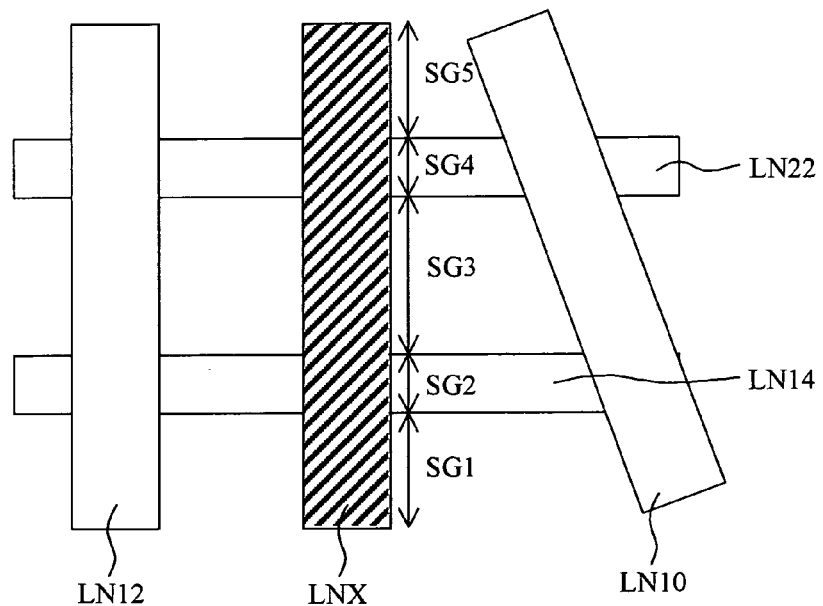
FIG. 11 is a plane view of FIG. 9.

FIG. 10 is a perspective view showing one example of a multilayer wiring structure; FIG. 11 is a plane view of same. In the perspective view of FIG. 10, an example of a four-layer multilayer wiring structure is shown. The main-axis wires LNX and LN12 to LN24 are provided in alternation in the X and Y directions in each of the wiring layers, and the diagonal wire LN10 is also provided as necessary. However, wires are not provided densely in all wiring layers, and depending on the layout design, there may exist wiring layers in which wires are provided densely and wiring layers in which wires are not provided densely. The plane view of FIG. 11 is a view of the wiring layer of the wires LNX, LN10, LN12 of FIG. 10 seen from above; in the lower layers only the wires LN14 and LN22 are visible. From this plane view, it is seem that the cross-sectional structure is different in each of the five segments SG1 to 5 of the wire of interest LNX. That is, in the segments SG1, SG3, SG5, horizontal-direction wires do not exist above or below, but in the segment SG2 the horizontal-direction wires LN14, LN30 exist above and below, and in the segment SG4 a horizontal-direction wire LN22 exists below. However, in segment SG3, although the absence of horizontal and vertical adjacent wires is the same, because the adjacent wire LN10 on the right side is a diagonal wire, the wire of interest LNX and the adjacent wire LN10 are not parallel, and the distance between the adjacent wires along the wire direction is not constant.

When there exist no diagonal wires, the wire of interest and adjacent wires are in either a parallel or an orthogonal relationship for all segments, so that in the capacitance extraction process extraction can be performed simply by performing matching with parameters in the RLC rule table. But if a diagonal wire exists, in order to perform ordinary matching, a wire segment must be divided more finely, as shown in FIG. 1. Such fine division increases the number of computer processes and so is undesirable.

[Capacitance Extraction Method]

Figure 12:
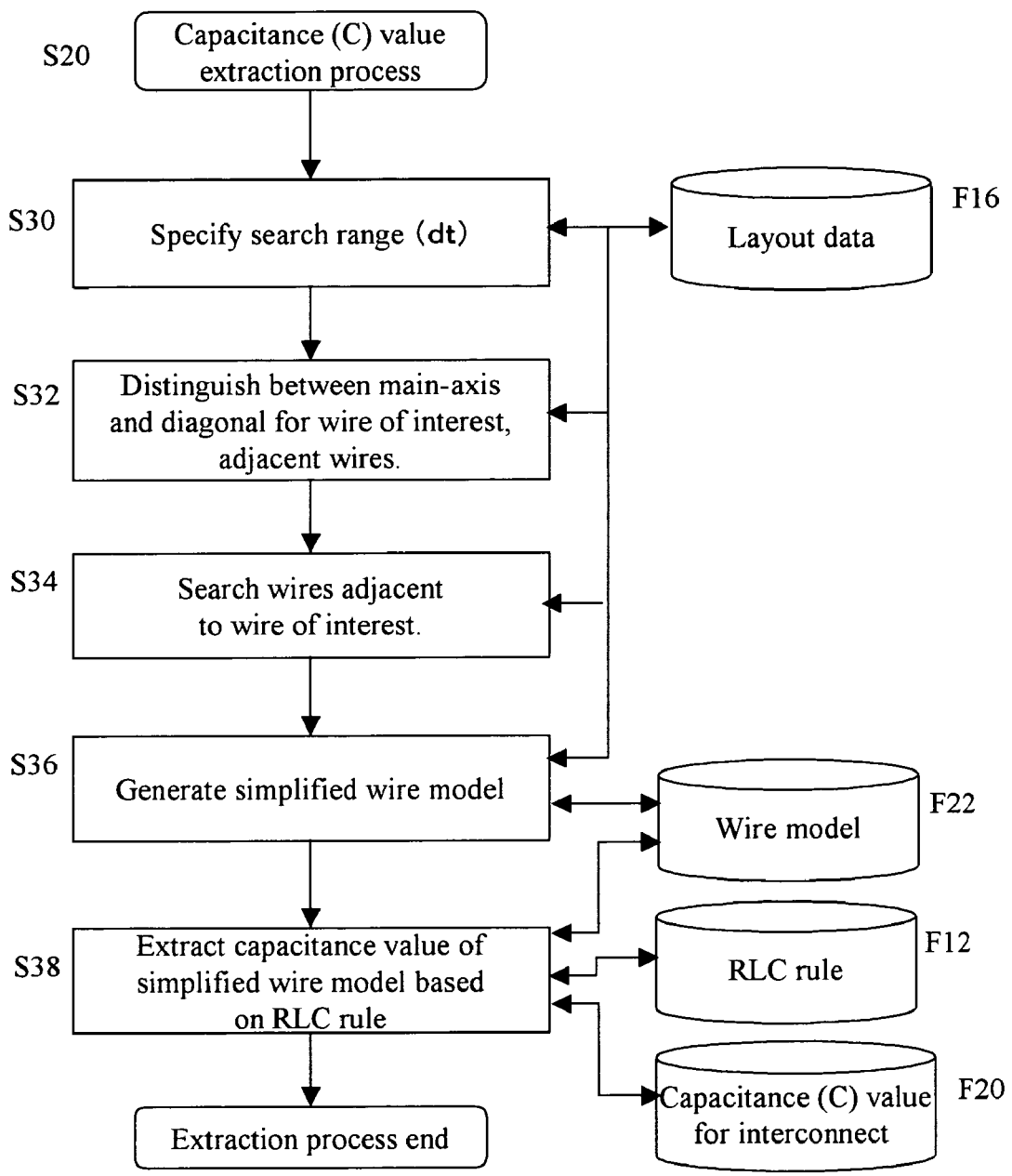
FIG. 12 is a flowchart of the capacitance extraction method of this aspect.
Figure 13:
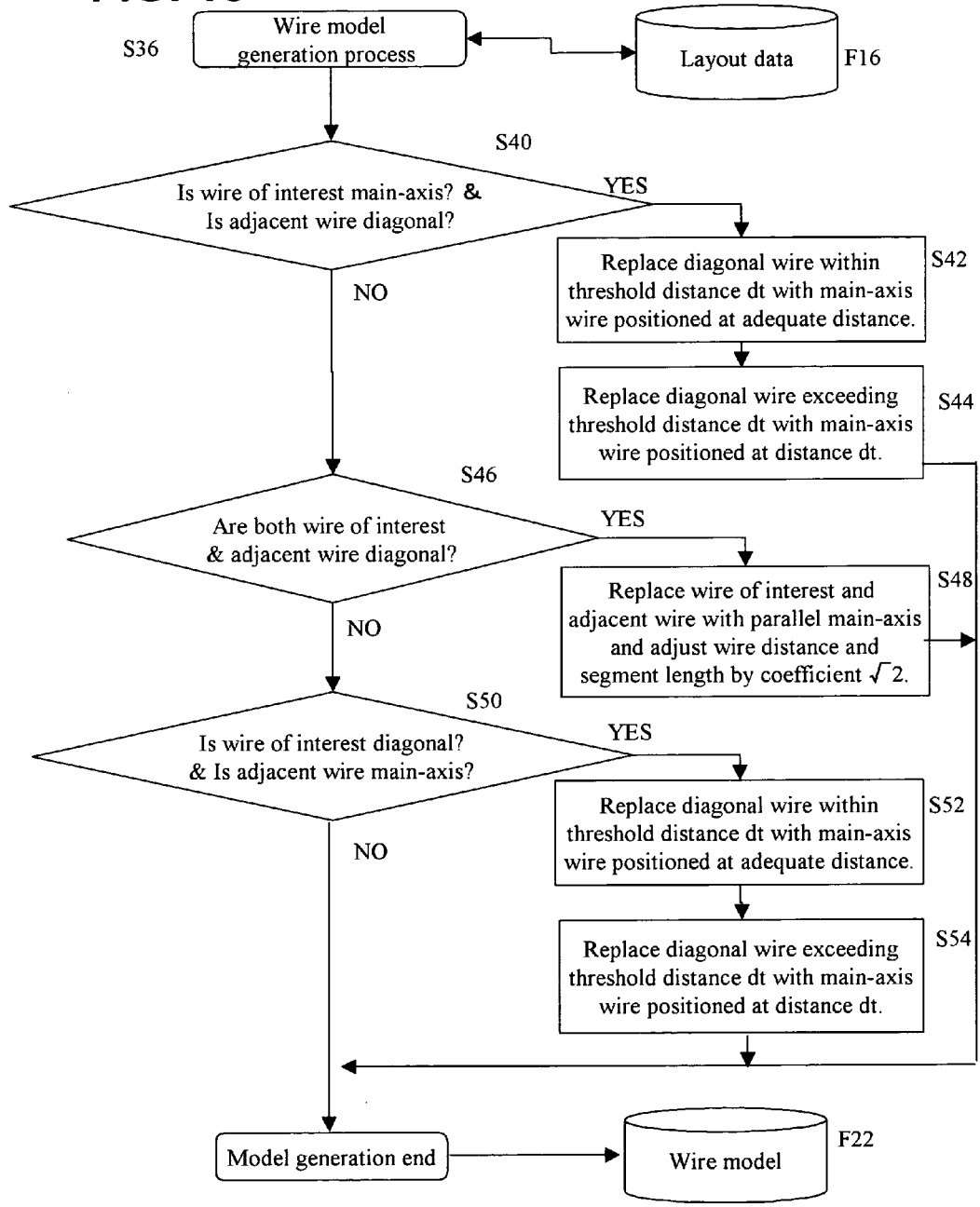
FIG. 13 is a flowchart of the wire model generation process of this aspect.

FIG. 12 is a flowchart of the capacitance extraction method of this aspect. FIG. 13 is a flowchart of the wire model generation process of this aspect. In the capacitance extraction process S20, as explained in FIG. 10 and FIG. 11, the capacitance value C is extracted for each wire segment. FIG. 12 and FIG. 13 describe the flow of processing for a single wire segment.

As indicated in FIG. 12, in the capacitance extraction process S20 a search range dt for wires adjacent to the wire of interest is specified (S30). As explained in FIG. 8, if the adjacent wire distance exceeds a threshold distance dt, a fixed value Ct not dependent on the distance is assigned as the capacitance value, and so this threshold distance dt is set. Adjacent wires existing within the threshold distance dt thus set and which are not parallel to the wire of interest have a capacitance value which depends on the distance, and so are replaced using the wire model of this aspect.

Figure 14:
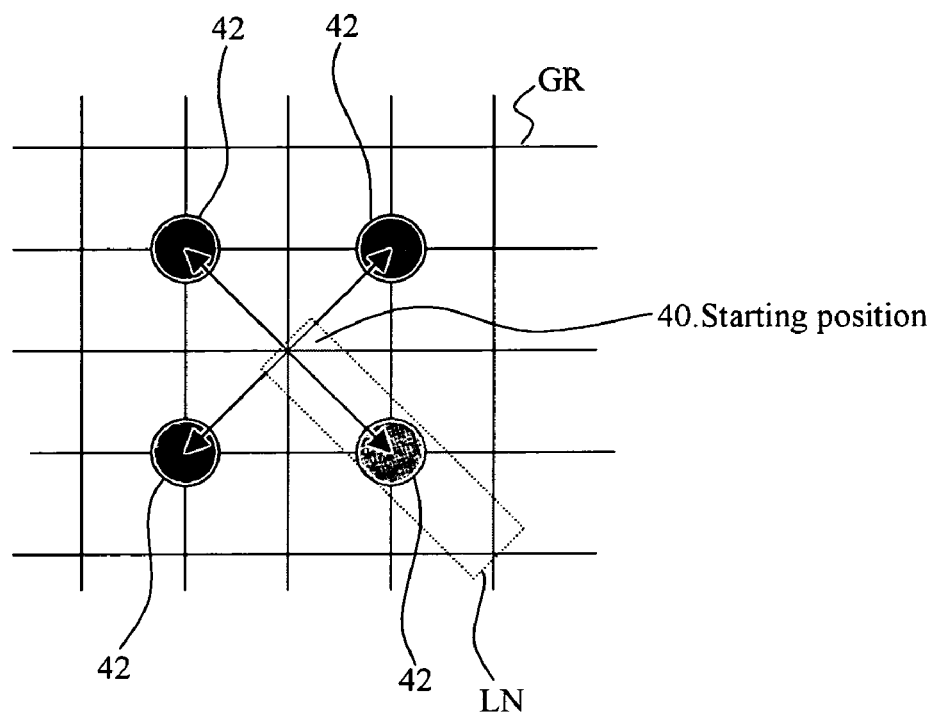
FIG. 14 shows the identification method of the wire identification process S32.

Next, identification of the wire of interest in a wire segment and an adjacent wire as either a main-axis wire or as a diagonal wire is performed (S32). FIG. 14 shows the identification method of the wire identification process S32. Whether a wire is diagonal or not can be judged according to whether the wire for identification LN exists on a diagonal-direction lattice point 42 of the grid GR from the starting point 40 of the wire LN. In the example of FIG. 14, the wire LN exists on the lattice point 42 in a right-downward diagonal direction from the starting point 40, and so can be identified as a diagonal wire. Similarly, by checking whether the wire for identification LN exists on lattice points in the X or Y directions of the grid from the starting point of the wire LN, it is possible to judge whether the wire is a main-axis wire. By means of this wire identification process, it is possible to identify a wire of interest or an adjacent wire in the wiring grid as either a main-axis wire or as a diagonal wire.

Figure 15A:
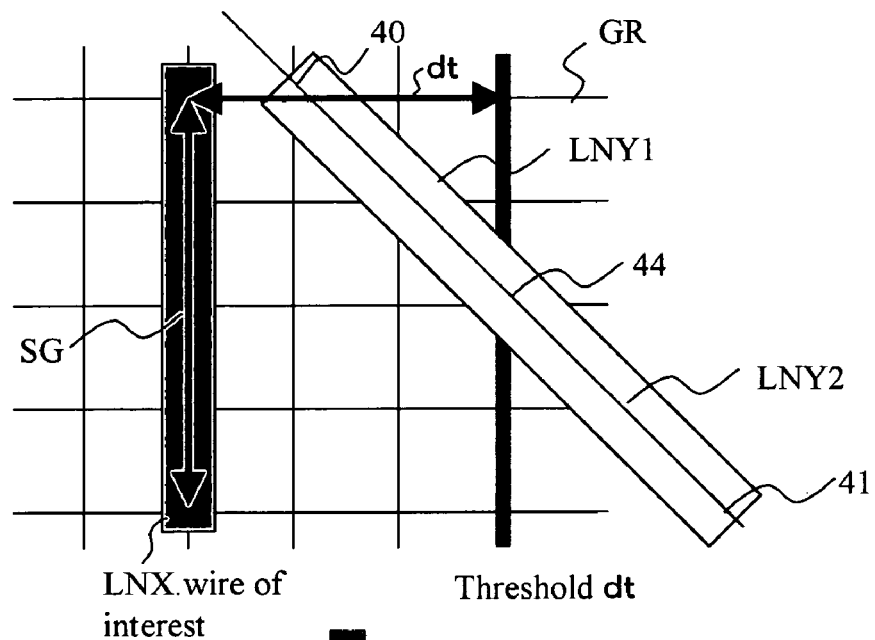
FIG. 15 is a drawing to explain the wire search process and wire model generation process.

Next, a search for wires adjacent to the wire of interest is performed (S34). FIG. 15 is a drawing to explain the wire search process and wire model generation process. FIG. 15A is an example in which the wire of interest is a main-axis wire in the Y-axis direction, and the adjacent wire LNY is a diagonal wire; a search is performed for the adjacent diagonal wire portion within the threshold distance dt from the wire of interest LNX. As a result, the adjacent diagonal wire LNY is divided into a diagonal wire portion LNY1 within the threshold distance dt, from the starting point 40 of the adjacent diagonal wire LNY to the position 44 of intersection with the grid at the threshold distance dt, and a diagonal wire portion LNY2 exceeding the threshold distance dt, from the position 44 to the ending point 41.

Figure 15B:
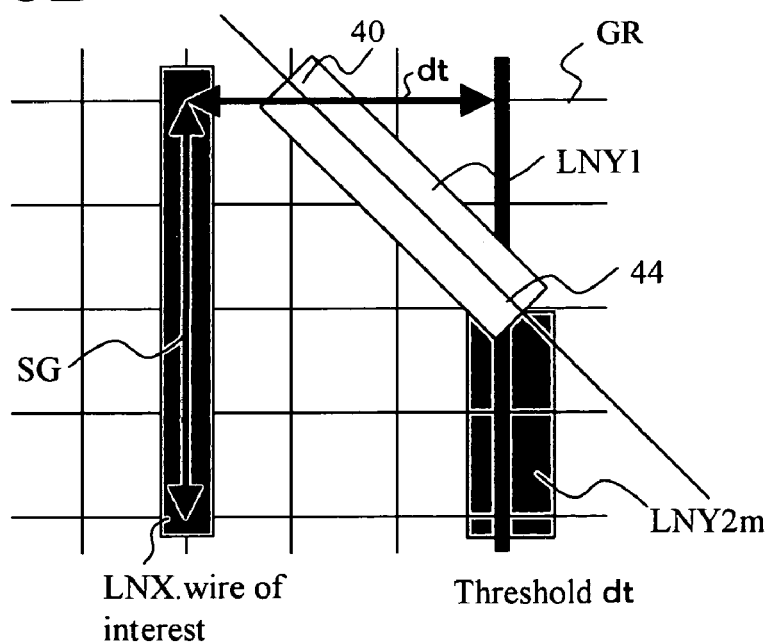

The adjacent wire LNY not parallel to the wire of interest LNX is then converted into a wire model parallel to the wire of interest (S36). In the wire model generation flowchart of FIG. 13, the example of FIG. 15 is an example in which the wire of interest is a main-axis wire and the adjacent wire is a diagonal wire, so that the result of the judgment process S40 is "YES", and the processes S42 and S44 are performed. That is, as shown in FIG. 15B, the portion LNY2 exceeding the threshold distance dt is regarded as having the distance-independent capacitance at the position exceeding the threshold distance dt, as explained in FIG. 8, and so is replaced with a wire model LNY2m parallel to the wire of interest LNX and separated by the threshold distance dt (S44 in FIG. 13). In this state, the diagonal wire portion LNY1 within the threshold distance dt from the wire of interest LNX remains. This diagonal wire portion LNY1 is the diagonal wire from the starting point 40 to the ending point 44.

Figure 16A:
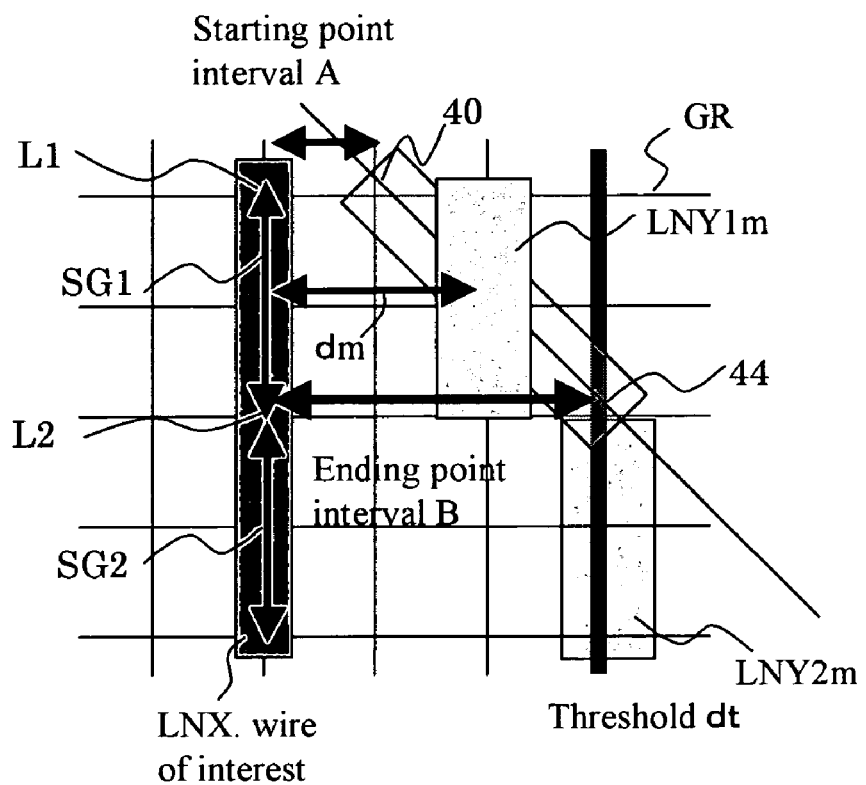
FIG. 16 is a drawing to explain the wire model generation process for a diagonal wire within a threshold distance dt.

FIG. 16 is a drawing to explain the wire model generation process for a diagonal wire within the threshold distance dt. As indicated in FIG. 16A, the diagonal wire LNX1 from the starting point 40 to the ending point 44 is replaced with a wire model LNY1m, parallel to the wire of interest on the grid and separated by the model interval dm from the wire of interest LNX (S42 in FIG. 13). As a result, the wire segment in the wire model is divided into SG1 and SG2, the segment SG1 has the wire of interest LNX and adjacent wire LNY1m, and the segment SG2 has the wire of interest LNX and the adjacent wire LNY2m. In both cases the wire of interest and the adjacent wire are parallel main-axis wires.

Figure 16B:
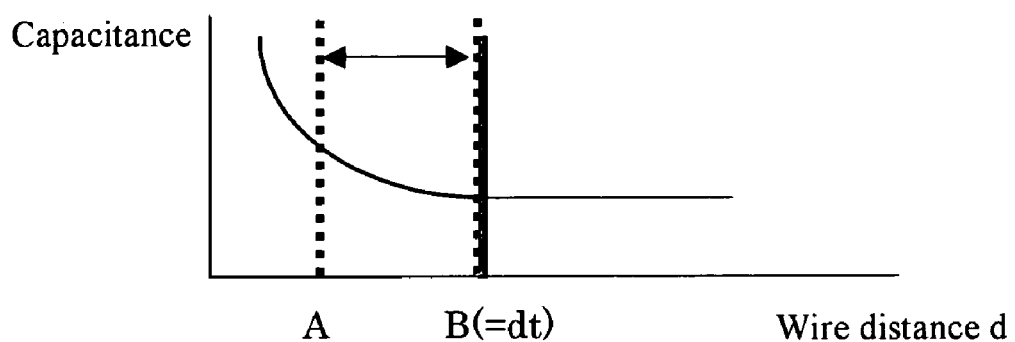

Here, the method of calculating the model interval dm is explained. In the segment SG1 of the wire of interest LNX, the interval with the adjacent wire LNY1 changes from the starting point L1 to the ending point L2, from the interval A to the interval B. Hence the capacitance with the adjacent wire LNY1 in the segment SG1 can be calculated by integrating, from the starting point L1 to the ending point L2, the capacitance $\epsilon S/d(L)$ obtained from the wire distance $d(L)$ which is a function of the coordinates L of the segment SG1. In other words, the calculation equation is as shown in FIG. 16B. It is thus sufficient to calculate the model interval dm such that the capacitance C is equal to the capacitance in the case of the wire model LNY1m. The model interval dm is calculated using this calculation method for the diagonal wire within the threshold distance dt from the wire of interest LNX, and the wire model LNY1m, parallel to the wire of interest, is generated at the position of this interval dm.

Figure 17A:
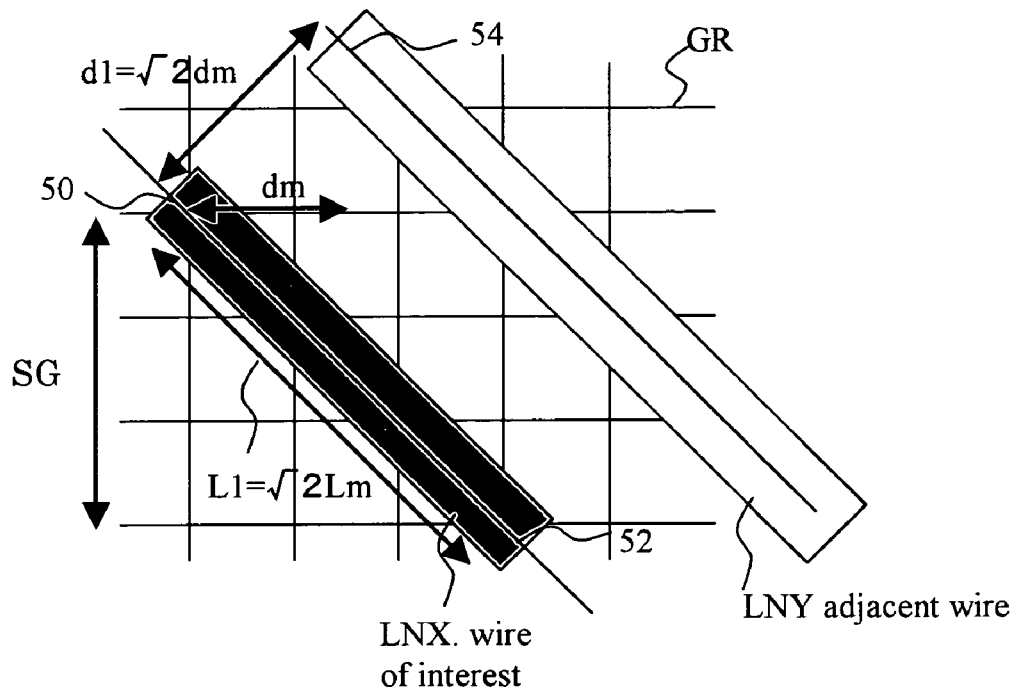
FIG. 17 is a drawing to explain the wire model generation process when the wire of interest and the adjacent wire are both diagonal wires.
Figure 17B:
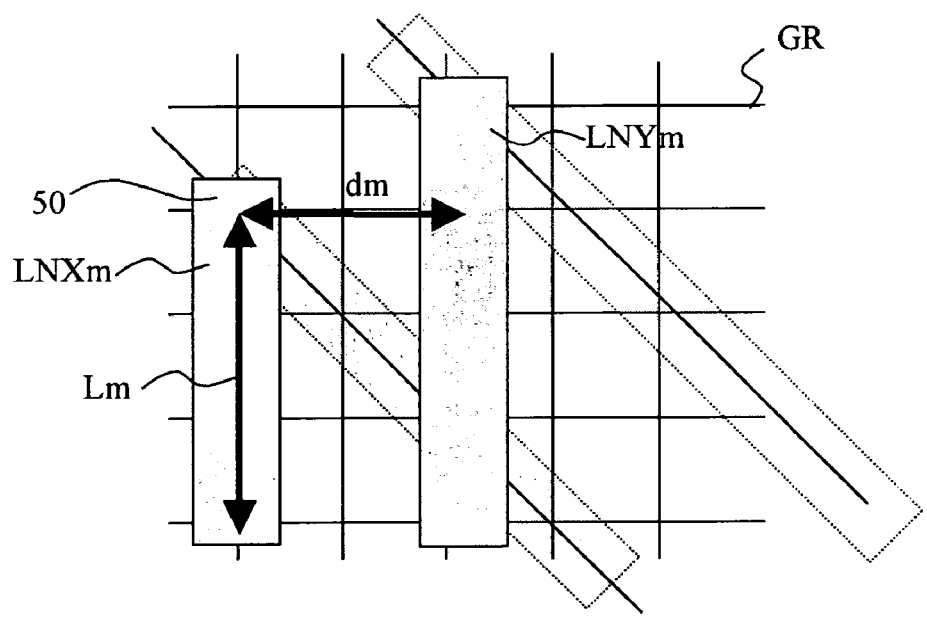

FIG. 17 is a drawing to explain the wire model generation process when the wire of interest and the adjacent wire are both diagonal wires. When as shown in FIG. 17A the wire of interest LNX and adjacent wire LNY are both diagonal wires, then as shown in FIG. 17B the wire of interest LNX is converted into a wire model LNXm which is a main-axis wire along the grid GR, without changing the starting point 50, and the adjacent wire LNY is also converted into a wire model LNYm which is a main-axis wire parallel to the wire model LNXm, without changing the starting point 54. However, in this case the distance dm between the starting points 50 and 54 in the X-axis direction, multiplied by a factor of $\sqrt{2}$, is the actual distance between wires d1. That is, the distance dm multiplied by $\sqrt{2}$ ($\sqrt{2}\cdot$dm) when both wires are rotated without changing the starting points must be regarded as the distance d1 between the wires in the wire model. Similarly, the length Lm of the wire model LNXm multiplied by $\sqrt{2}$ upon rotation about the starting point 50 must be regarded as the actual length L1 (=$\sqrt{2}\cdot$Lm) of the wire of interest LNX. Hence as the data for the wire model, the interval between wires is taken to be $\sqrt{2}\cdot$dm, and the wire length to be $\sqrt{2}\cdot$Lm (S48 in FIG. 13). In a wire model generated in this way, the wire of interest and the adjacent wire are both replaced by main-axis wires, so that in the segment SG the wire of interest and adjacent wire, parallel to each other and of length $\sqrt{2}\cdot$Lm, are separated by the interval $\sqrt{2}\cdot$dm, and in the capacitance extraction process the RLC rule table can be referenced to extract the capacitance for the segment SG.

Figure 18:
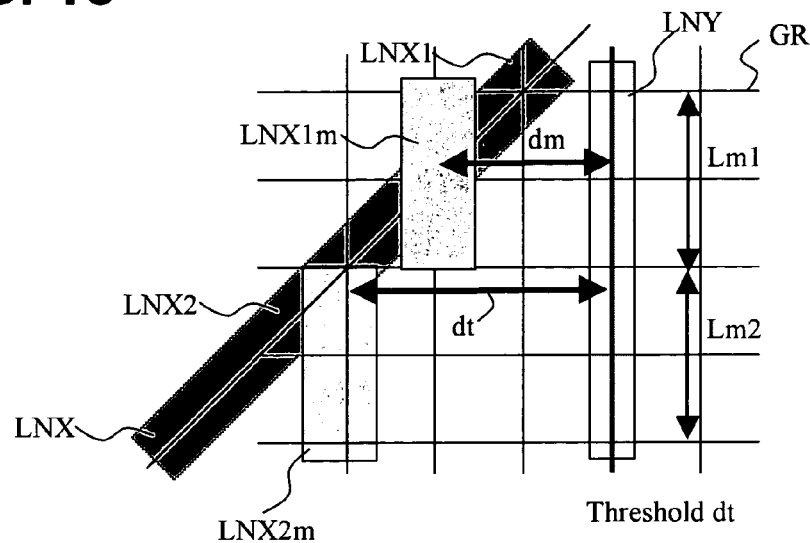
FIG. 18 is a drawing to explain the wire model generation process when the wire of interest is a diagonal wire and the adjacent wire is a main-axis wire; and, FIG. 19 shows an RC model extracted from a wire model.

FIG. 18 is a drawing to explain the wire model generation process when the wire of interest is a diagonal wire and the adjacent wire is a main-axis wire. The wire of interest LNX is a diagonal wire, and the adjacent wire LNY is a main-axis wire positioned along the grid GR. In this case, in contrast with the examples of FIG. 15 and FIG. 16, the wire of interest LNX is replaced by a main-axis wire parallel to the adjacent wire. In this case, similarly to FIG. 15 and FIG. 16, a check is performed to determine whether the distance to the adjacent wire, from the starting point to the ending point of the wire of interest LNX, exceeds the threshold distance dt, and the wire of interest LNX is divided into the portion within the threshold distance dt and the portion exceeding the threshold distance. The portion LNX2 exceeding the threshold is replaced by a wire model LNX2m having a main-axis wire at a distance dt from the adjacent wire LNY (S54 in FIG. 13). The portion LNX1 not exceeding the threshold distance is replaced by a wire model LNX1m having a main-axis wire at the position of the model distance dm calculated by the capacitance calculation explained in FIG. 16 (S52 in FIG. 13). That is, the wire of interest LNX is divided into two segments including the wire models LNX1m and LNX2m. Also, the length data of the wire models LNX1m, LNX2m is the lengths Lm1, Lm2 of the replaced wire models, multiplied by $\sqrt{2}$ in order to match the actual original lengths.

Figure 19:
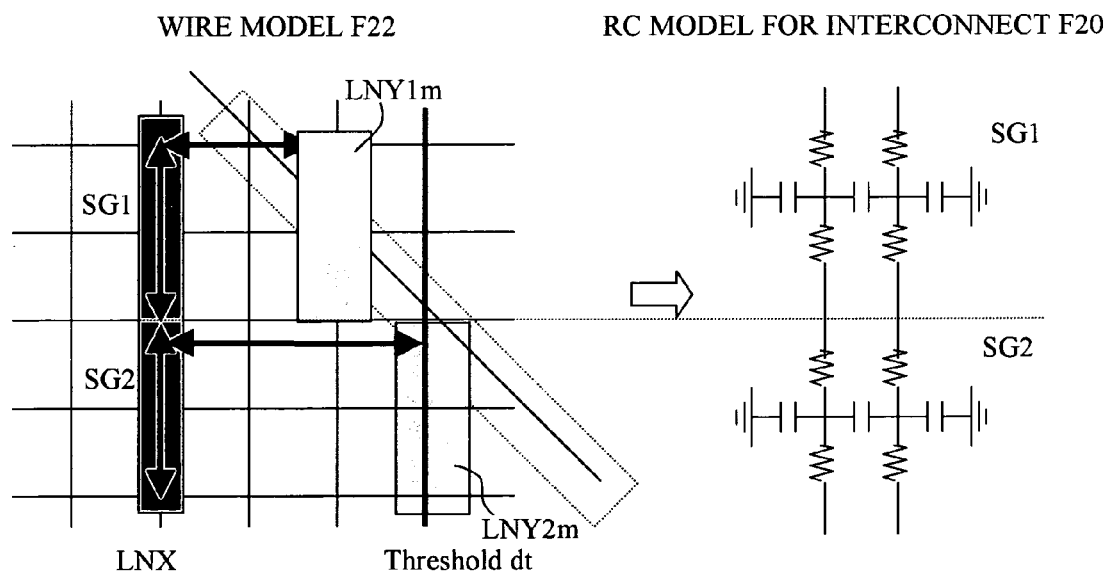

FIG. 19 shows an RC model extracted from a wire model. Returning to the flowchart of FIG. 12, for each wire segment of the wire of interest, an adjacent wire that is not parallel to the wire of interest or diagonal wire is replaced by a parallel main-axis wire in the layout data F16 to generate a wire model F22, which is subjected to matching of parameters in the RLC rule table F12 with the model distances dm, dt for each segment to extract capacitances for matching parameters, and by this means an RC model F20 for the wire of interest can be generated (S38 in FIG. 12). As shown in FIG. 19, by generating the wire model F22 increases in the number of segments in the capacitance extraction process can be prevented, and increases in the number of capacitance extraction processes can be prevented. And, an RC model F20 generated in this way can also be simplified compared with the RC models 31 to 34 shown in FIG. 1B, so that the number of processes in the delay time calculation process S22 of the logic verification process shown in FIG. 5 can also be reduced.

In the above-described aspect, a method of generation of a wire model for a wire of interest and adjacent wires in the same wiring layer was explained. However, this aspect can be similarly applied even when the wire of interest and the adjacent wires are in different wiring layers. For example, when in FIG. 10 the wire of interest is LN24, if the adjacent wire LN10 above the wire of interest is a diagonal wire, the portion of the adjacent wire LN10 within the threshold distance dt from the wire of interest LN24 is replaced by a parallel main-axis wire at the position of the model distance dm from the wire of interest calculated from the capacitance value obtained by integration in the length direction of the wire of interest, and the portion of the adjacent wire LN10 exceeding the threshold distance dt is replaced by a parallel main-axis wire at the threshold distance dt.

By means of the above aspect, the number of capacitance extraction processes can be reduced, the RC model for the extracted capacitances can be simplified, and the number of delay time calculation processes in the logic verification process can also be reduced.

What is claimed is:

1. A wire capacitance extraction method for interconnects in an integrated circuit, comprising:
   a wire model generation step of generating wire model data by replacing a wire of interest or a wire adjacent to the wire of interest with a main-axis wire so that both wires become parallel with an interval of prescribed distance therebetween, for a wire segment of the wire of interest, which is included in layout data of said interconnects, and in which the wire of interest and the wire adjacent to the wire of interest are not parallel; and
   a capacitance extraction step of extracting a capacitance value for said wire segment of the wire of interest included in the wire model data, based on said prescribed distance.

2. The wire capacitance extraction method according to claim 1, wherein said wire model generation step has a process of calculating said prescribed distance based on a capacitance value which is obtained by integration from a starting point to an ending point of said wire segment according to a distance between said wire of interest and the wire adjacent to the wire of interest.

3. The wire capacitance extraction method according to claim 1, wherein, in said wire model generation step, when there is a portion of said wire segment of the wire of interest such that the distance between the wire of interest and the wire adjacent to the wire of interest exceeds a prescribed threshold distance, the portion exceeding the threshold distance is replaced by a wire segment having the wire of interest and the wire adjacent to the wire of interest being parallel with an interval of said threshold distance, and the portion not exceeding said threshold distance is replaced by a wire segment having the wire of interest and the wire adjacent to the wire of interest being parallel with an interval of said prescribed distance.

4. The wire capacitance extraction method according to claim 1, wherein said layout data has main-axis wires extending in X and Y directions and diagonal wires extending in directions diagonal to the X and Y directions, and when said wire of interest is the main-axis wire and said wire adjacent to the wire of interest is the diagonal wire, in said wire model generation step, the wire adjacent to the wire of interest is replaced by a main-axis wire to become parallel to said wire of interest.

5. The wire capacitance extraction method according to claim 1, wherein said layout data has main-axis wires extending in X and Y directions and diagonal wires extending in directions diagonal to the X and Y directions, and when said wire of interest is the diagonal wire and said wire adjacent to the wire of interest is the main-axis wire, in said wire model generation step, the wire of interest is replaced by a main-axis wire to become parallel to said wire adjacent to the wire of interest.

6. The wire capacitance extraction method according to claim 1, wherein said layout data has main-axis wires extending in the X and Y directions and diagonal wires extending in directions diagonal to the X and Y directions, and when both said wire of interest and said wire adjacent to the wire of interest are diagonal wires, in said wire model generation step, the wire of interest and said wire adjacent to the wire of interest are both replaced by main-axis wires parallel to each other.

7. The wire capacitance extraction method according to claim 1, wherein said capacitance extraction step has a process of referencing a capacitance rule table having capacitance values corresponding to parameters for distance from the wire adjacent to the wire of interest, and of extracting, as the capacitance value for the wire segment, the capacitance value corresponding to parameter matching to said prescribed distance.

8. A wire capacitance extraction method for interconnects in an integrated circuit, comprising:
   a wire model generation step of generating wire model data by replacing diagonal wires which extend in directions diagonal to X and Y directions with parallel main-axis wires which extend in the X and Y directions with an interval of prescribed distance between the parallel main-axis wires, for a wire segment of a wire of interest in which either the wire of interest or a wire adjacent to the wire of interest is one of said diagonal wires, and which is included in layout data of said interconnects having the main-axis wires and the diagonal wires; and
   a capacitance extraction step of extracting a capacitance value for said wire segment of the wire of interest included in the wire model data, based on said prescribed distance.

9. The wire capacitance extraction method according to claim 8, wherein said wire model generation step has a process of calculating said prescribed distance based on a capacitance value which is obtained by integration from a starting point to an ending point of said wire segment of the wire of interest according to a distance between said wire of interest and the wire adjacent to the wire of interest.

10. A wire capacitance extraction program causing a computer to execute a procedure to extract a capacitance value of interconnects in an integrated circuit, wherein said procedure comprises:
    a wire model generation procedure of generating wire model data by replacing a wire of interest or a wire adjacent to the wire of interest with a main-axis wire so that both wires become parallel with an interval of prescribed distance therebetween, for a wire segment of the wire of interest, which is included in layout data of said interconnects, and in which the wire of interest and the wire adjacent to the wire of interest are not parallel; and
    a capacitance extraction procedure of extracting a capacitance value for said wire segment of the wire of interest included in the wire model data, based on said prescribed distance.

11. The wire capacitance extraction program according to claim 10, wherein said wire model generation procedure has a procedure of calculating said prescribed distance based on a capacitance value which is obtained by integration from a starting point to an ending point of said wire segment according to a distance between said wire of interest and the wire adjacent to the wire of interest.

12. The wire capacitance extraction program according to claim 10, wherein, in said wire model generation procedure, when there is a portion of said wire segment of the wire of interest such that the distance between the wire of interest and the wire adjacent to the wire of interest exceeds a prescribed threshold distance, the portion exceeding the threshold distance is replaced by a wire segment having the wire of interest and the wire adjacent to the wire of interest being parallel with an interval of said threshold distance, and the portion not exceeding said threshold distance is replaced by a wire segment having the wire of interest and the wire adjacent to the wire of interest being parallel with an interval of said prescribed distance.

13. A wire capacitance extraction program causing a computer to execute a procedure to extract a capacitance value of interconnects in an integrated circuit, wherein said procedure comprises:
  a wire model generation procedure of generating wire model data by replacing diagonal wires which extend in directions diagonal to X and Y directions with parallel main-axis wires which extend in the X and Y directions with an interval of prescribed distance between the parallel main-axis wires, for a wire segment of a wire of interest, in which either the wire of interest or a wire adjacent to the wire of interest is one of said diagonal wires, and which is included in layout data of said interconnects having the main-axis wires and the diagonal wires; and
  a capacitance extraction procedure of extracting a capacitance value for said wire segment of the wire of interest included in the wire model data, based on said prescribed distance.

14. The wire capacitance extraction program according to claim 13, wherein said wire model generation procedure has a process of calculating said prescribed distance based on a capacitance value which is obtained by integration from a starting point to an ending point of said wire segment of the wire of interest according to a distance between said wire of interest and the wire adjacent to the wire of interest, in case one of said wire of interest and the wire adjacent to the wire of interest of said wire segment is a main-axis wire and the other is a diagonal wire.

* * * * *

UNITED STATES PATENT AND TRADEMARK OFFICE
CERTIFICATE OF CORRECTION

PATENT NO. : 7,185,296 B2  Page 1 of 1
APPLICATION NO. : 10/898960
DATED : February 27, 2007
INVENTOR(S) : Hiyashi Ohba et al.

It is certified that error appears in the above-identified patent and that said Letters Patent is hereby corrected as shown below:

Column 12, Line 29, After "interest" insert --,--. (First Occurrence)

Signed and Sealed this

Nineteenth Day of June, 2007

JON W. DUDAS
*Director of the United States Patent and Trademark Office*